US009940427B2

(12) United States Patent
Crouse et al.

(10) Patent No.: US 9,940,427 B2
(45) Date of Patent: Apr. 10, 2018

(54) LENS HEATING AWARE SOURCE MASK OPTIMIZATION FOR ADVANCED LITHOGRAPHY

(71) Applicants: Michael Matthew M. Crouse, Albany, NY (US); Youri Johannes Laurentius Maria Van Dommelen, Ballston Lake, NY (US); Peng Liu, Sunnyvale, CA (US); Hua-Yu Liu, Palo Alto, CA (US); Aiqin Jiang, Guilderland, NY (US); Wenjin Huang, San Jose, CA (US)

(72) Inventors: Michael Matthew M. Crouse, Albany, NY (US); Youri Johannes Laurentius Maria Van Dommelen, Ballston Lake, NY (US); Peng Liu, Sunnyvale, CA (US); Hua-Yu Liu, Palo Alto, CA (US); Aiqin Jiang, Guilderland, NY (US); Wenjin Huang, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 504 days.

(21) Appl. No.: 13/753,401

(22) Filed: Jan. 29, 2013

(65) Prior Publication Data
US 2013/0212543 A1 Aug. 15, 2013

Related U.S. Application Data

(60) Provisional application No. 61/597,047, filed on Feb. 9, 2012.

(51) Int. Cl.
*G06F 17/50* (2006.01)
*G03F 7/20* (2006.01)

(52) U.S. Cl.
CPC .......... *G06F 17/5081* (2013.01); *G03F 7/705* (2013.01); *G03F 7/70125* (2013.01); *G03F 7/70433* (2013.01); *G03F 7/70891* (2013.01)

(58) Field of Classification Search
CPC ....................................................... G06F 17/50
(Continued)

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

CN 101308517 11/2008
CN 102466984 5/2012
(Continued)

OTHER PUBLICATIONS

Taiwan Office Action dated Feb. 26, 2015 in corresponding Taiwan Patent Application No. 102105036.
(Continued)

*Primary Examiner* — Thuan Do
(74) *Attorney, Agent, or Firm* — Pillsbury Winthrop Shaw Pittman LLP

(57) ABSTRACT

A computer-implemented method for improving a lithographic process for imaging a portion of a design layout onto a substrate using a lithographic projection apparatus comprising an illumination source and projection optics, the method including computing a multi-variable cost function of a plurality of design variables that are characteristics of the lithographic process, at least some of the design variables being characteristics of the illumination source and the design layout, the computing of the multi-variable cost function accounting for lens heating effects; and reconfiguring the characteristics of the lithographic process by adjusting the design variables until a predefined termination condition is satisfied.

20 Claims, 14 Drawing Sheets

(58) Field of Classification Search
USPC .......................................................... 716/52
See application file for complete search history.

(56) References Cited

U.S. PATENT DOCUMENTS

| | | | |
|---|---|---|---|
| 5,523,193 A | 6/1996 | Nelson | |
| 5,969,441 A | 10/1999 | Loopstra et al. | |
| 6,046,792 A | 4/2000 | Van Der Werf et al. | |
| 6,504,597 B2 | 1/2003 | Schuster et al. | |
| 6,563,564 B2 | 5/2003 | De Mol et al. | |
| 7,003,758 B2 | 2/2006 | Ye et al. | |
| 7,587,704 B2 | 9/2009 | Ye et al. | |
| 8,200,468 B2 | 6/2012 | Ye et al. | |
| 8,560,978 B2* | 10/2013 | Feng et al. | 716/52 |
| 8,570,485 B2 | 10/2013 | Ye et al. | |
| 8,584,056 B2 | 11/2013 | Chen et al. | |
| 2002/0036758 A1 | 3/2002 | De Mol et al. | |
| 2008/0174756 A1 | 7/2008 | Granik | |
| 2009/0296055 A1 | 12/2009 | Ye et al. | |
| 2011/0099526 A1 | 4/2011 | Liu et al. | |
| 2011/0230999 A1 | 9/2011 | Chen et al. | |
| 2012/0117522 A1* | 5/2012 | Feng | G03F 1/70 716/54 |

FOREIGN PATENT DOCUMENTS

| | | |
|---|---|---|
| JP | 8-221261 | 8/1996 |
| JP | 2002-015997 | 1/2002 |
| JP | 2006-245374 | 9/2006 |
| JP | 2010-517078 | 5/2010 |
| JP | 2011-522441 | 7/2011 |
| JP | 2012-510165 | 4/2012 |
| TW | 201142488 | 12/2011 |

OTHER PUBLICATIONS

Chris Spence, "Full-Chip Lithography Simulation and Design Analysis—How OPC Is Changing IC Design," Proc. SPIE, vol. 5751, pp. 1-14 (2005).

Yu Cao et al. "Optimized Hardware and Software for Fast, Full Chip Simulation," Proc. SPIE, vol. 5754, pp. 407-414 (2005).

Alan E. Rosenbluth et al., "Optimum Mask and Source Patterns to Print a Given Shape," J. Microlith., Microfab., Microsyst., vol. 1, No. 1, pp. 13-30 (Apr. 2002).

Yuri Granik, "Source Optimization for Image Fidelity and Throughput," J. Microlith., Microfab., Microsyst., vol. 3, No. 4, pp. 509-522 (Oct. 2004).

* cited by examiner

LENS HEATING AWARE SOURCE MASK OPTIMIZATION FOR ADVANCED LITHOGRAPHY

CROSS-REFERENCE TO RELATED APPLICATIONS

This application claims priority to U.S. Provisional Application No. 61/597,047, filed Feb. 9, 2012, the content of which is incorporated by reference herein in its entirety.

FIELD

The description herein relates to lithographic apparatuses and processes, and more particularly to tools for optimizing illumination sources and masks design layouts for use in lithographic apparatuses and processes.

BACKGROUND

A lithographic projection apparatus can be used, for example, in the manufacture of integrated circuits (ICs). In such a case, a mask may contain a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the mask. In general, a single substrate contains a plurality of adjacent target portions to which the circuit pattern is transferred successively by the lithographic projection apparatus, one target portion at a time. In one type of lithographic projection apparatuses, the circuit pattern on the entire mask is transferred onto one target portion in one go; such an apparatus is commonly referred to as a wafer stepper. In an alternative apparatus, commonly referred to as a step-and-scan apparatus, a projection beam scans over the mask in a given reference direction (the "scanning" direction) while synchronously moving the substrate parallel or anti-parallel to this reference direction. Different portions of the circuit pattern on the mask are transferred to one target portion progressively. Since, in general, the lithographic projection apparatus will have a magnification factor M (generally <1), the speed F at which the substrate is moved will be a factor M times that at which the projection beam scans the mask. More information with regard to lithographic devices as described herein can be gleaned, for example, from U.S. Pat. No. 6,046,792, incorporated herein by reference.

A lithography process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the lithographic projection apparatus as well as to the design layout. These include, for example, but not limited to, optimization of NA and optical coherence settings, customized illumination schemes, use of phase shifting masks, optical proximity correction (OPC, sometimes also referred to as "optical and process correction") in the design layout, or other methods generally defined as "resolution enhancement techniques" (RET).

As one example, OPC addresses the fact that the final size and placement of an image of the design layout projected on the substrate will not be identical to, or simply depend only on the size and placement of the design layout on the mask. It is noted that the terms "mask" and "reticle" are utilized interchangeably herein. Furthermore, masks and reticles can be broadly termed "patterning devices." Also, person skilled in the art will recognize that, especially in the context of lithography simulation/optimization, the term "mask" and "design layout" can be used interchangeably, as in lithography simulation/optimization, a physical mask is not necessarily used but a design layout can be used to represent a physical mask. For the small feature sizes and high feature densities present on some design layout, the position of a particular edge of a given feature will be influenced to a certain extent by the presence or absence of other adjacent features. These proximity effects arise from minute amounts of light coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout requires some modification in order to achieve high fidelity of the projected image to the target design. These modifications may include shifting or biasing of edge positions or line widths as well as application of "assist" features that are intended to assist projection of other features. The assist features may include SRAF (Sub Resolution Assist Features) or PRAF (Printable Resolution Assist Features).

Application of model-based OPC to a target design requires good process models and considerable computational resources, given the many millions of features typically present in a chip design. However, applying OPC is generally not an "exact science," but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the manufacturing of a mask. This is driven by the enormous cost of making high-end masks, which run in the multi-million dollar range, as well as by the impact on turn-around time by reworking or repairing actual masks once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

In addition to optimization to design layouts or masks (e.g., OPC), the illumination source can also optimized, either jointly with mask optimization or separately, in an effort to improve the overall lithography fidelity. Since the 1990s, many off-axis illumination sources, such as annular, quadrupole, and dipole, have been introduced, and have provided more freedom for OPC design, thereby improving the imaging results. As is known, off-axis illumination is a proven way to resolve fine structures (i.e., target features) contained in the mask. However, when compared to a traditional illumination source, an off-axis illumination source usually provides less light intensity for the aerial image (AI). Thus, it becomes desirable to attempt to optimize the illumination source to achieve the optimal balance between finer resolution and reduced light intensity. The terms "illumination source" and "source" are used interchangeably in this document.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for wafer image fidelity and the smoothness requirement of the source.

It is well-known that during exposures, elements in the projections system absorb radiation, heat-up and therefore introduce aberrations into the projection system, resulting in reduced image quality at substrate level. These effects are particularly acute when using illumination modes, such as dipole and quadrupole illuminations, and/or deep ultraviolet radiation (DUV), e.g. at 198, 157 or 126 nm, since the choice of materials from which lenses useable with these wavelengths can be made is generally limited and even the best materials have significant coefficients of absorption at those wavelengths. The problem particularly affects projection systems formed by refractive lens elements and is therefore often referred to as lens heating. Even with cooling systems that maintain the projection system at a constant temperature, sufficient local temperature variations can occur which can cause noticeable loss of imaging quality.

Therefore, many projection systems in lithographic projection apparatus are provided with one or more actuated adjustable elements whose shape, position and/or orientation in one or more degrees of freedom can be adjusted during or between exposures to compensate for lens heating effects. A computer model predicts the lens heating effects that are expected and calculates appropriate corrections to be effected by the adjustable elements. Prior art computer models have calculated the lens heating effects in terms of Zernike polynomials describing the aberrations in the pupil plane of the projection system and applied corrections via control "knobs" on the projection system that adjust one or more adjustable elements to give a correction corresponding to the relevant Zernike polynomial. However, prior art lens heating correction methods have not always been completely effective and some residual aberrations often occur.

For example, referring to FIG. 1, this figure shows the impact of various illumination shapes (dipole and quadrupole illuminations) for a particular mask design layout on the odd order Zernike coefficients across the pupil fields (−12.72-12.72). As can be seen in FIG. 1, optical aberrations induced by lens heating and represented by Zernike coefficient Z10 significantly vary across the pupil field for the first three illumination shapes.

Other attempts to deal with the problem of non-uniform lens heating include the provision of additional light sources, e.g. infra-red, to heat the "cold" parts, i.e. those not traversed by the intense parts of the projection beam, of elements of the projection system, see U.S. Pat. No. 6,504,597 and JP-A-08-221261. The former reference addresses non-uniform heating caused by a slit-shaped illumination field and the latter reference addresses non-uniform heating caused by zonal or modified illumination. The provision of such additional light sources and guides to conduct the additional heating radiation to the correct places may increase the complexity of the apparatus and the increased heat load in the projection system necessitates the provision of a cooling system of higher capacity.

Two approaches are conventionally pursued to account for lens heating effects.

In a first approach, which is commonly used by lithography users to control lens heating issues in a production environment, the lens heating behavior is experimentally measured during a production lot. This empirically-generated lens heating data can then be used to calculate corrections which are applied to the projection system during a lot exposure. A series of lens actuators are available in the lithographic apparatus and can be used to move active elements, as the lens heats, that reduce the aberration signature through the production lot.

However, because the first approach is entirely driven by experiments, this requires that the lithographic apparatus be used during a significant amount of time to collect the lens heating data which are specific to the process under study. Moreover, in some circumstances, the lithographic apparatus does not have the dynamic range necessary to correct for the entire range of aberrations observed during production. Thus, limitations of the lithographic apparatus should also be considered for this empirically driven approach.

In a second approach, the expected lens heating signature is modeled through a simulation program (e.g. Tachyon Lens Heating Module). The simulations of the expected lens heating signature allow users to examine the predicted behavior of a proposed mask layout or pattern and identify the features that are most sensitive to lens heating-induced aberrations. Based on the predicted lens heating impact, the design can be iteratively modified to mitigate the most severe lens heating-induced aberrations. While time consuming and iterative in nature, this second approach is faster than the first approach which is driven entirely by lens heating experiments and lithographic apparatus controls.

The second scenario for advanced users is beneficial in that it does not require lengthy lithographic apparatus experiments. However, this second approach is an iterative approach, which can be lengthy. Moreover, the design team would need to iteratively "tweak" key circuit layouts to work around lens heating concerns discovered by the process team. Coordination of the design teams and process teams to this degree would be challenging at best. The iterative approach of changing the design to mitigate lens heating may prove to be difficult to implement in an actual development environment.

SUMMARY

In an aspect, there is provided a computer-implemented method for improving a lithographic process for imaging a portion of a design layout onto a substrate using a lithographic projection apparatus comprising an illumination source and projection optics, the method including computing a multi-variable cost function of a plurality of design variables that are characteristics of the lithographic process, at least some of the design variables being characteristics of the illumination source and the design layout, the computing of the multi-variable cost function accounting for lens heating effects; and reconfiguring the characteristics of the lithographic process by adjusting the design variables until a predefined termination condition is satisfied.

In another aspect, there is provided a computer program product comprising a computer readable medium having instructions recorded thereon, the instructions when executed by a computer implementing a method for improving a lithographic process for imaging a portion of a design layout onto a substrate using a lithographic projection apparatus comprising an illumination source and projection optics, the method including computing a multi-variable cost function of a plurality of design variables that are characteristics of the lithographic process, at least some of the design variables being characteristics of the illumination source and the design layout, the computing of the multi-variable cost function accounting for lens heating effects; and reconfiguring the characteristics of the lithographic process by adjusting the design variables until a predefined termination condition is satisfied.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
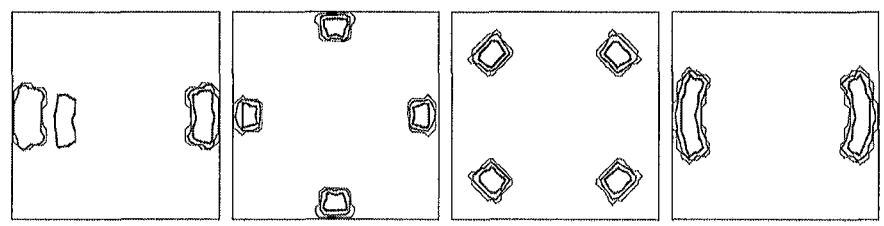
FIG. 1 shows the impact of various illumination shapes (dipole and quadrupole illuminations) for a particular mask design layout on the odd order Zernike coefficients across the pupil field.
Figure 1:
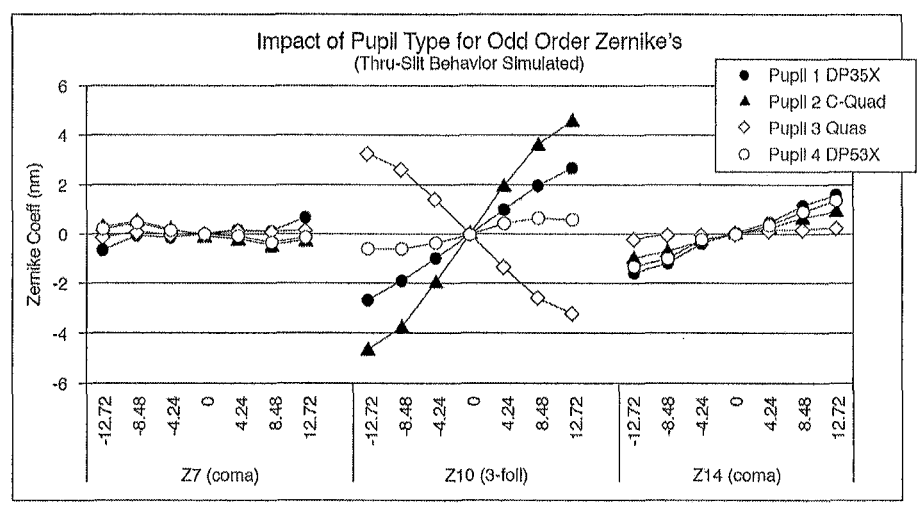

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The mask referred to above comprise design layouts. The design layouts can be generated utilizing CAD (computer-aided design) programs, this process often being referred to as EDA (electronic design automation). Most CAD programs follow a set of predetermined design rules in order to create functional design layouts/masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the mask).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Figure 2:
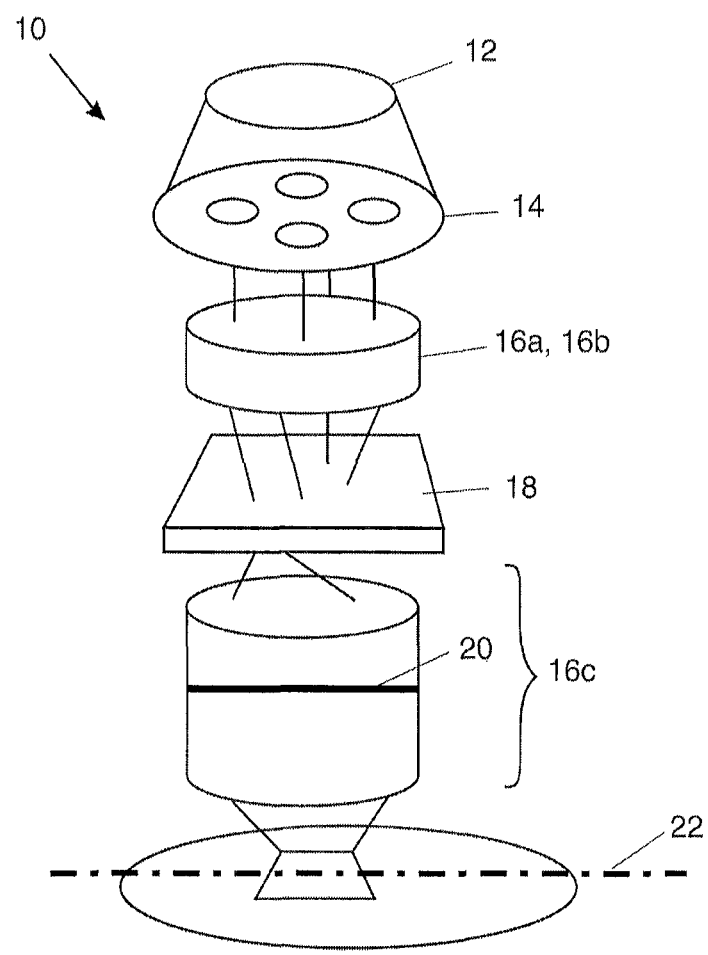
FIG. 2 is a block diagram of various subsystems of a lithography system according to an embodiment.

As a brief introduction, FIG. 2 illustrates an exemplary lithographic projection apparatus 10. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape light from the source 12; a mask or reticle 18; and transmission optics 16c that project an image of the reticle pattern onto a substrate plane 22. An adjustable filter or aperture 20 at the pupil plane of the projection optics may restrict the range of beam angles that impinge on the substrate plane 22, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or mask manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination through a mask and onto a substrate. The term "projection optics" is broadly defined here to include any optical component that may alter the wavefront of the radiation beam. For example, projection optics may include at least some of the components 14, 16a, 16b and 16c. An aerial image (AI) is the light intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the mask and the projection optics) dictate the aerial image. Since the mask used in the lithographic projection apparatus can be changed, it is desirable to separate the optical properties of the mask from the optical properties of the rest of the lithographic projection apparatus including at least the source and the projection optics.

Figure 3:
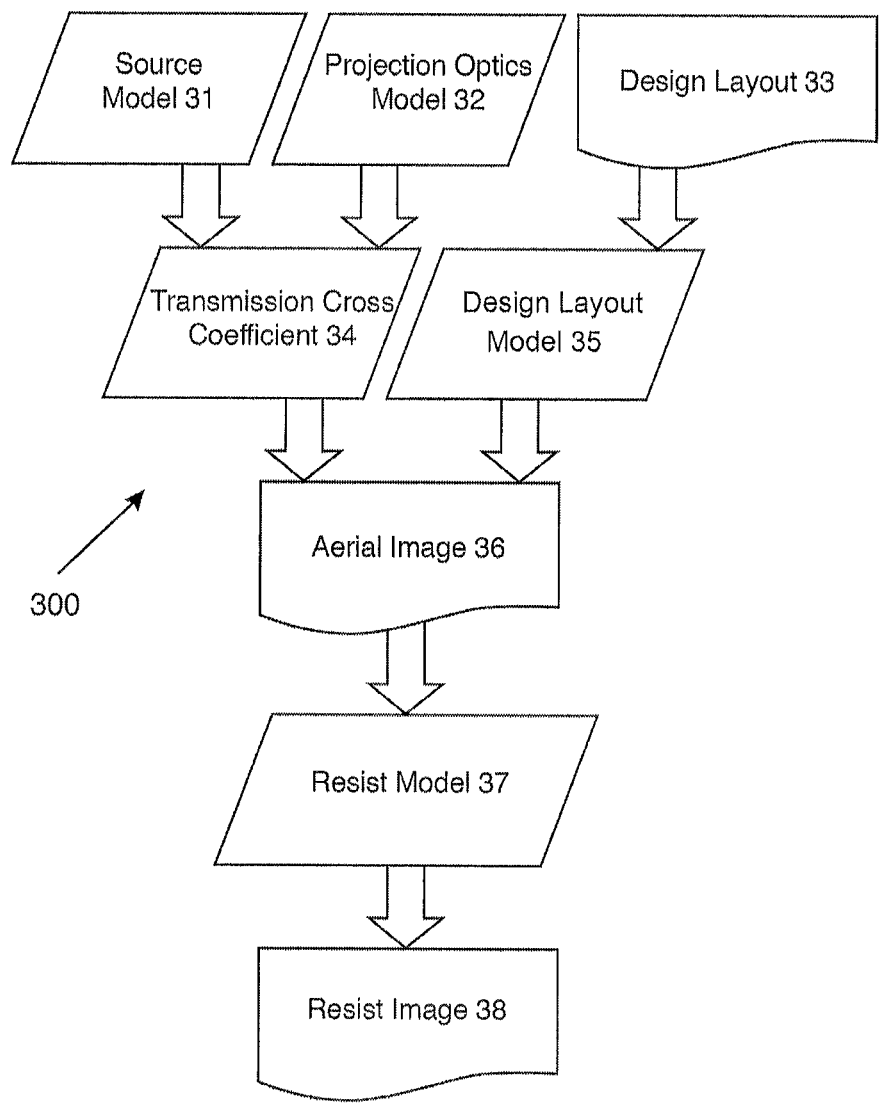
FIG. 3 is a block diagram of simulation models corresponding to the subsystems in FIG. 2.

An exemplary flow chart for simulating lithography in a lithographic projection apparatus is illustrated in FIG. 3. A source model 31 represents optical characteristics (including light intensity distribution and/or phase distribution) of the source. A projection optics model 32 represents optical characteristics (including changes to the light intensity distribution and/or the phase distribution caused by the projection optics) of the projection optics. The projection optics model 32 may include aberration caused by various factors, for example, heating of the components of the projection optics. The source model 31 and the projection optics model 32 can be combined, as explained later herein, into a transmission cross coefficient (TCC) model 34. A design layout model 35 represents optical characteristics (including changes to the light intensity distribution and/or the phase distribution caused by a given design layout 33) of a design layout 33, which is the representation of an arrangement of features on a mask. An aerial image 36 can be simulated from the transmission cross coefficient 34 and the design layout model 35. A resist image 37 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis light sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 35 can also represent physical properties of a physical mask, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Radiation incident on the projection system is typically partially transmitted through the designed radiation path. In an embodiment, light is used as radiation and the radiation path is referred to as a light path. A portion of the incident light may be reflected or refracted away from the light path and a further portion of the incident light may be absorbed by the lens system. Heat energy converted from the incident light will typically be retained in the lens, which is generally a poor heat conductor, and lens heating can cause expansion of the lens which may affect the optical properties of the lens. The effect of lens heating is frequently non-uniform because of the variations in the cross-sectional area of the lens that cause some parts of the lens to generate and retain greater quantities of heat than other parts of the lens. Thus, non-uniform heating of lens portions can result in local changes to the refractive index of the lens resulting in modified optical paths and aberrations detectable in the patterns produced in a photo-resist.

Furthermore, systems that employ diffraction optical elements (e.g. pupil elements) to selectively illuminate parts of the lens create areas of the lens that receive relatively high intensity light while other areas receive little or no light and resultant heating (see, e.g. the quadrupole illumination pattern depicted in FIG. 1). Thus, differences in lens heating can create significant temperature gradients within a lens that affect the optical properties of the lens proportionate to the local temperature and the structure of the lens and illumination patterns. Changes in lens function may be reduced or substantially eliminated in some scanners through the use of lens manipulators configured to apply and/or relieve pressure on selected areas and/or points of the lens that offsets or negates the effect of lens heating. These manipulators can minimize aberration and control other user-specified litho metrics such as CD variations caused by lens heating. Certain embodiments provide models that include characterizations of corrective systems used to ameliorate lens heating induced aberrations in order to reduce printing defects on wafers. Therefore, it is contemplated that one or more embodiments can be included in optimization and correction systems and methods that comprise models, simulations and applications that characterize lens heating effects and control of manipulators and other corrective systems.

Various embodiments provide methods and systems to include lens heating into the source mask optimization (SMO) calculation. This process can be referred to hereinafter as the lens-heating aware SMO. In an embodiment, the algorithm for the lens-heating aware SMO is configured to optimize the diffraction pattern and the aerial image of the design, which is done with SMO, but with the additional functionality that a lens heating sensitivity metric or set of metrics is calculated. In one embodiment, if the lens heating sensitivity metric fell outside of an acceptable range, the SMO calculation can be re-optimized with a newly suggested starting point for RET/OPC code. Examples of methods describing SMO procedures can be found, for example, in U.S. patent application Ser. No. 12/914,946 filed Oct. 28, 2010, the disclosure of which is hereby incorporated by reference in its entirety.

Figure 4A:
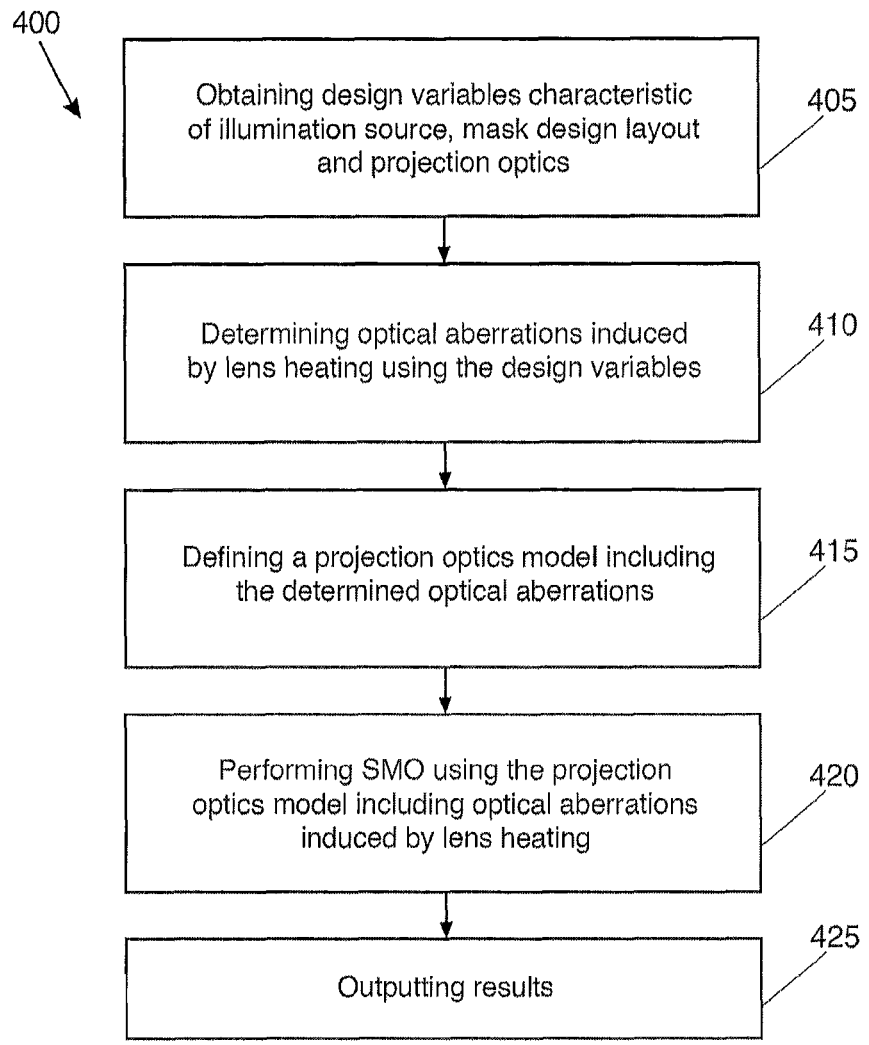
FIG. 4A is a flow diagram illustrating aspects of an example methodology of an optimization according to an embodiment.

Referring to FIG. 4A, this figure shows an exemplary method 400 for simulating lithography in a lithography projection apparatus according to an embodiment.

The method comprises a procedure 405 in which the design variables that are characteristics of the illumination source, the design layout and the projection optics, including their tuning ranges, are obtained. At procedure 410, an effect on the optical characteristics (e.g., optical aberrations) of the projection optics induced by imaging the design layout (or a portion thereof) with the illumination source through the projection optics, are determined and/or predicted using at least some of the design variables that are characteristics of the illumination source and the mask design layout. The effect may comprise a heating effect of the projection optics (may be referred to as "lens heating" hereafter). Lens heating may not be uniform and may be dependent on some of the design variables characteristic of the design layout and the illumination source. The effect may comprise other effects such as refraction index change, temperature change, transparency change, physical dimension change, etc., at at least a portion of the projection optics. In one embodiment, the procedure 410 may include determining and/or estimating the temperature or change of temperature of various portions of the projection optics. The determination of the effect such as that generated by lens heating can be carried out using a suitable model such as a lens heating model, as described for example in U.S. patent application Ser. No. 12/475,071, filed on May 29, 2009, which is incorporated by reference in its entirety.

In one or more embodiments, the lens heating model may determine the effect (e.g., aberration) by calculating CDs (critical dimensions) of the design layout as a function of lens changes.

In certain embodiments, CDs may be expressed in a non-linear function of Zernike polynomials. Zernike polynomials are useful in expressing wavefront data in polynomial form and Zernike polynomials comprise terms that are similar in form to aberrations associated with optical systems. Generally, Zernike coefficients correspond to the weights of the polynomials. In certain embodiments, Zernike coefficients are numbers representative of a perturbation in the CD. If the Zernike coefficient is zero, there is no perturbation (see, e.g., Zernike coefficient Z7 of FIG. 1). Typically a second order polynomial can be used to represent aberrations resulting from lens heating and a lithometric-Zernike relationship can be established through simulation and/or measurement of photolithographic images.

The optical aberrations determined at procedure 410 can then be used to define at procedure 415 a projection optics model that accounts for (e.g., is a function of) the effect (e.g., aberrations induced by lens heating). Once the projection optics model of procedure 415 is defined, the method proceeds to procedure 420 where a source mask optimization (SMO) is carried out and the results of the SMO procedure are outputted at procedure 425.

As will be appreciated by the skilled artisan, the projection optics model accounting for the effect (e.g., aberrations) depends on the design variables because adjustment of the design variables induces changes to the effect. The projection optics model may be expressed as a set of transmission cross coefficients TCCs. The modified set of transmission cross coefficients can then be used along with the design layout model to construct the aerial image model. As known in the art, the transmission cross coefficients include optical properties of the lithographic projection apparatus excluding the mask.

It will also be appreciated by the skilled artisan that the method 400 of FIG. 4A is an iterative method. That is, the source mask optimization includes simultaneously adjusting the design variables of the illumination source and the design layout until a termination condition is satisfied. In each iteration, adjusted design variables, some of which are characteristic of the illumination source and the design layout can be used to determine and/or adjust the effect on the optical characteristics of the projection optics. The determined/adjusted effect can then be used to determine an adjusted projection optics model, and a set of adjusted transmission cross coefficients that will be used in this iteration to determine an aerial image.

Figure 4B:
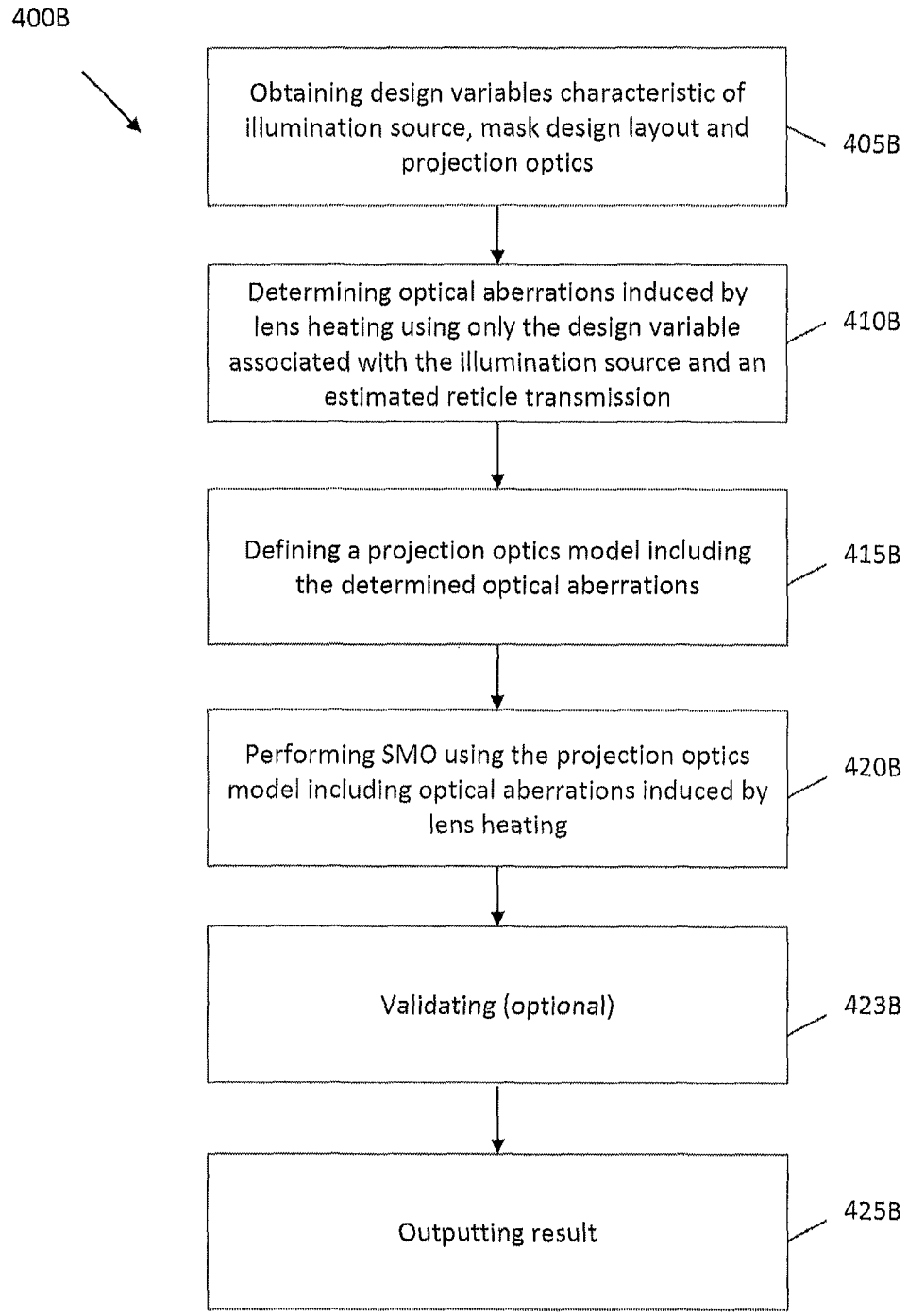
FIG. 4B is a flow diagram illustrating aspects of an example methodology of an optimization according to an embodiment.

Referring to FIG. 4B, this figure shows an exemplary method 400B for simulating lithography in a lithography projection apparatus according to an embodiment. The method comprises a procedure 405B in which the design variables that are characteristics of the illumination source, the design layout and the projection optics, including their tuning ranges, are obtained. At procedure 410B, an effect on the optical characteristics (e.g., optical aberrations) of the projection optics induced by imaging the design layout (or a portion thereof) with the illumination source through the projection optics, are determined and/or predicted using only the design variables that are characteristics of the illumination source and a simplified reticle. Using the "simplified reticle" means not all details of the reticle are used in the calculation. In an example, the simplified reticle may be an estimated reticle transmission, which may be calculated based on the ratio of the area of the reticle covered by patterns to the area of the reticle. Alternatively, the estimated reticle transmission may be a measured average transmission of a physical mask. In another example, the simplified reticle may be a clip from the reticle. In yet another example, the simplified reticle may be several discrete portions of the reticle. The effect may comprise lens heating. Lens heating may not be uniform and may be dependent on some of the design variables characteristic of the design layout and the illumination source. The effect may comprise other effects such as refraction index change, temperature change, transparency change, physical dimension change, etc., at at least a portion of the projection optics. In one embodiment, the procedure 410B may include determining and/or estimating the temperature or change of temperature of various portions of the projection optics. The determination of the effect such as that generated by lens heating can be carried out using a suitable model such as a lens heating model, as described for example in U.S. patent application Ser. No. 12/475,071, filed on May 29, 2009, which is incorporated by reference in its entirety.

The optical aberrations determined at procedure 410B can then be used to define at procedure 415B a projection optics model that accounts for (e.g., is a function of) the effect (e.g., aberrations induced by lens heating). Once the projection optics model of procedure 415B is defined, the method proceeds to procedure 420B where a source mask optimization (SMO) is carried out and the results of the SMO procedure are outputted at procedure 425B. An optional validation procedure 423B may be carried out before procedure 425B. In the optional validation procedure 423B, the result of procedure 420B is compared to an SMO result with details (e.g., design variables characteristic of the design layout in addition to the estimated reticle transmission) taken into account. If they are not sufficiently close, the method can go back to procedure 410B.

As will be appreciated by the skilled artisan, the projection optics model accounting for the effect (e.g., aberrations) depends on the design variables because adjustment of the design variables induces changes to the effect. The projection optics model may be expressed as a set of transmission cross coefficients TCCs. The modified set of transmission cross coefficients can then be used along with the design layout model to construct the aerial image model. As known in the art, the transmission cross coefficients include optical properties of the lithographic projection apparatus excluding the mask.

It will also be appreciated by the skilled artisan that the method 400B of FIG. 4B is an iterative method. That is, the source mask optimization includes simultaneously adjusting the design variables of the illumination source and the design layout until a termination condition is satisfied. In each iteration, adjusted design variables characteristic of the illumination source and the simplified reticle can be used to determine and/or adjust the effect on the optical characteristics of the projection optics. The determined/adjusted effect can then be used to determine an adjusted projection optics model, and a set of adjusted transmission cross coefficients that will be used in this iteration to determine an aerial image. Compared to the method 400, the method 400B is less computationally costly because not all details of the reticle are used to determine and/or adjust the effect on the optical characteristics of the projection optics.

Figure 4C:
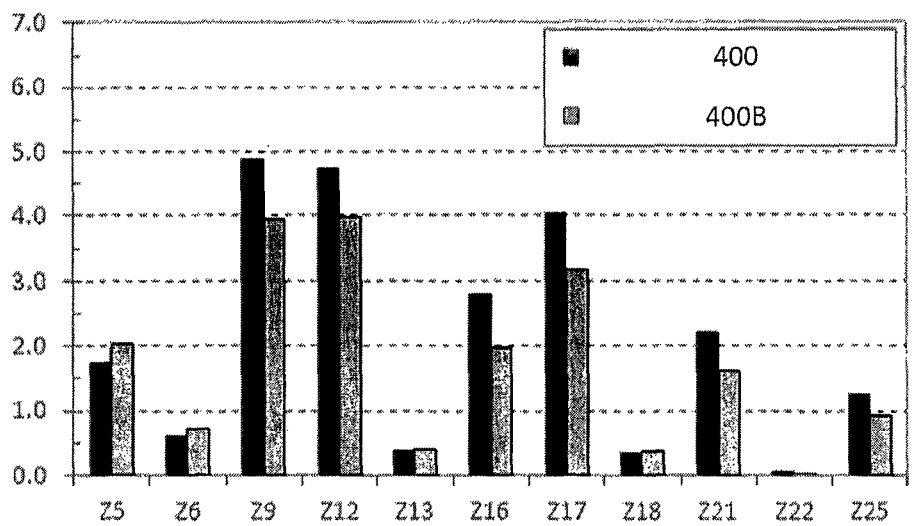
FIG. 4C shows exemplary comparison of projection optics models of FIGS. 4A and 4B
Figure 4C:
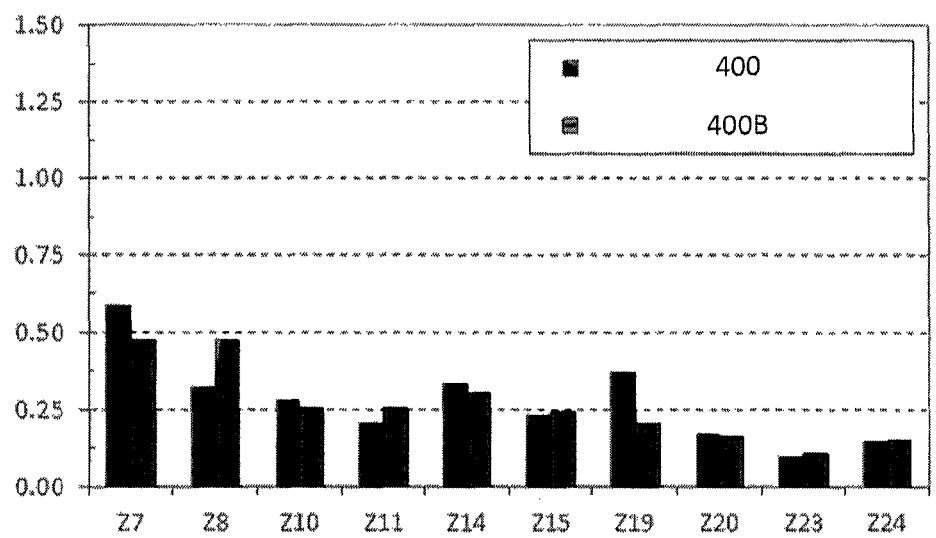

FIG. 4C shows exemplary comparison of the projection optics models of methods 400 and 400B. The horizontal axes are Zernike polynomial terms. The vertical axes are the coefficients or magnitude of these terms.

In one or more embodiments, the SMO procedure can be performed using a cost function, which may be expressed as follows $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof; $f_p(z_1, z_2, \ldots, z_N)$ is a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the wafer, or any point on a virtual design layout, or resist image, or aerial image. The cost function may represent any suitable characteristics of the lithographic projection apparatus or the substrate, for instance, focus, CD, image shift, image distortion, image rotation, etc. For example, the cost function may be a function of one or more of the following lithographic metrics: edge placement error, critical dimension, resist contour distance, worst defect size, and best focus shift. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the mask, the projection optics, dose, focus, etc. In an embodiment, at least some of the design variables are adjustable characteristics of the projection optics. The projection optics may include components collectively called a "wavefront manipulator" that can be used to adjust shapes of a wavefront and intensity distribution and/or phase shift of the irradiation beam. The projection optics can adjust a wavefront and intensity distribution at any location along an optical path of the lithographic projection apparatus, such as before the mask, near a pupil plane, near an image plane, near a focal plane. The projection optics can be used to correct or compensate for certain distortions of the wavefront and intensity distribution caused by, for example, the source, the mask, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if the PW (Process Window) is maximized, it is possible to consider the same physical location from different PW conditions as different evaluation points in the cost function in (Eq. 1). For example, if N PW conditions are considered, then the evaluation points can be categorized according to their PW conditions and the cost functions can be written as:

$$CF(z_1, z_2, \ldots, z_N) = \quad \text{(Eq. 1')}$$
$$\sum_{p=1}^{P} w_p f_p^2(z_1, z_2, \ldots, z_N) = \sum_{u=1}^{U}\sum_{p_u=1}^{P_u} w_{p_u} f_{p_u}^2(z_1, z_2, \ldots, z)$$

where $f_{p_i}(z_1, z_2, \ldots, z_N)$ is the difference between an actual value and an intended value of the $p_i$-th evaluation point for a set of values of the design variables of $(z_1, z_2, \ldots, z_N)$ under the u-th PW condition $u=1, \ldots, U$. When this difference is the edge placement error (EPE), then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the wafer EPE and the induced mask edge bias.

The design variables may have constraints, which can be expressed as $(z_1, z_2, \ldots, z_N) \in Z$, where Z is a set of possible values of the design variables. The constraints may represent physical restrictions in a hardware implementation of the lithographic projection apparatus. The constraints may include one or more of: tuning ranges, rules governing mask manufacturability, and interdependence between the design variables.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \underset{(z_1, z_2, K, z_N) \in Z}{\operatorname{argmin}} CF(z_1, z_2, \ldots, z_N) = \quad \text{(Eq. 2)}$$

-continued $$\underset{(z_1,z_2,K,z_N)\in Z}{\operatorname{argmin}} \sum_{p=1}^{P} w_p f_p^2(z_1, z_2, \ldots, z_N)$$

Figure 5:
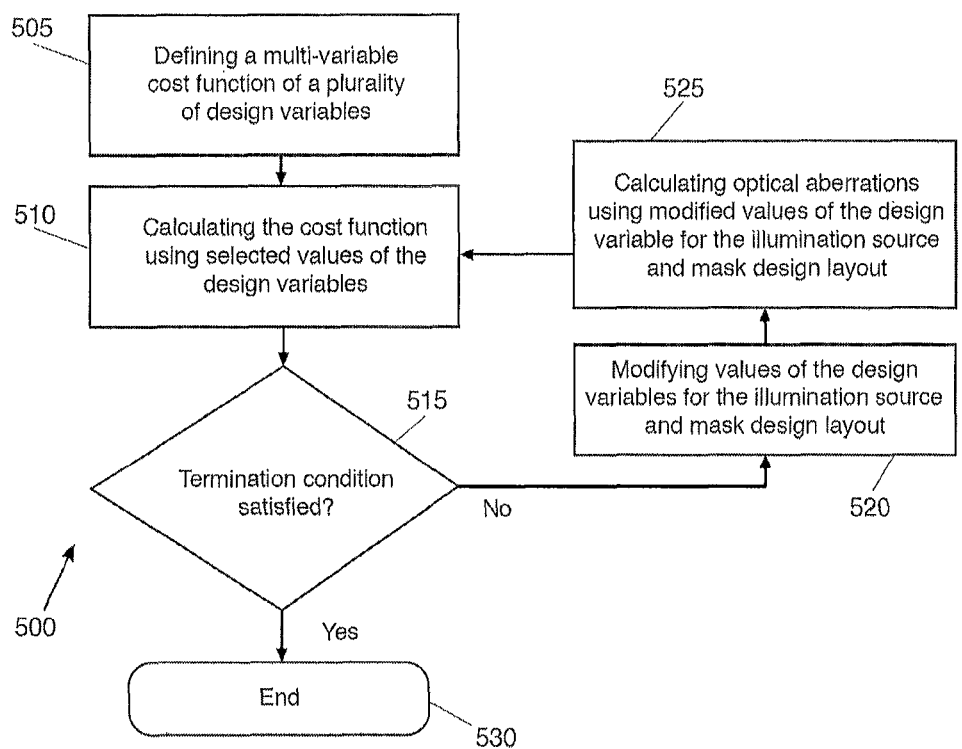
FIG. 5 shows an embodiment of an SMO method according to an embodiment.
Figure 6A:
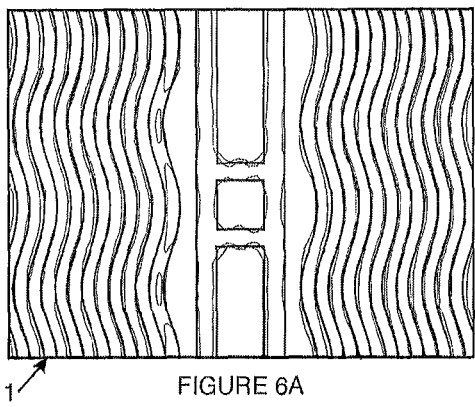
FIGS. 6A-D show four different mask patterns that illustrate the lens heating effects on the resist image.
Figure 6C:
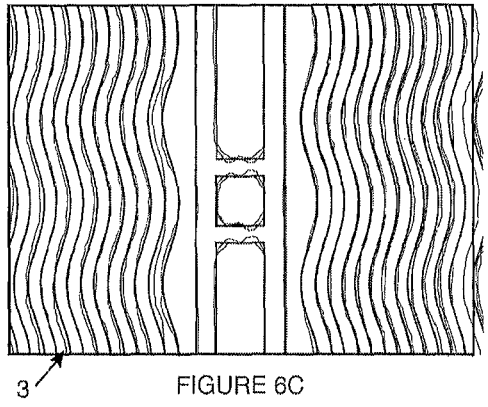
Figure 6B:
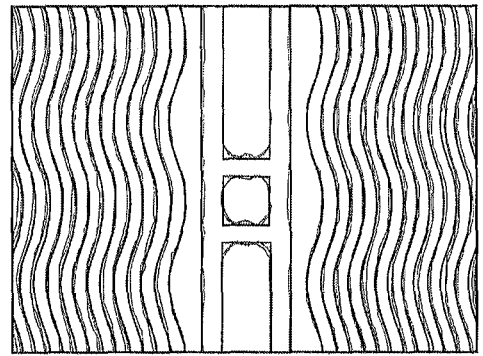
Figure 6D:
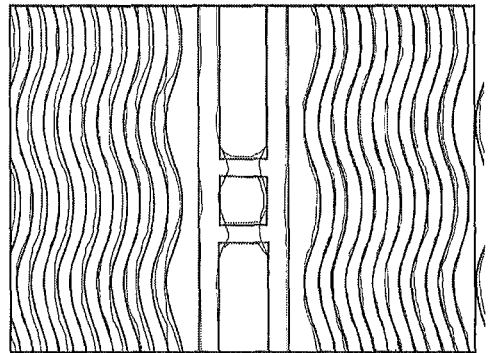

A SMO method of optimizing the lithography projection apparatus, according to an embodiment, is illustrated in FIG. 5. This method comprises a procedure 505 of defining a multi-variable cost function of a plurality of design variables. The design variables are characteristics of the illumination source and the mask design layout. In procedure 510, the cost function is calculated or computer using the selected variables. As will be appreciated by the skilled artisan, as part of calculating the cost function, the image of the mask pattern/layout is calculated. This is done using the projection optics model including the optical aberrations (see procedure 415). Once the cost function is calculated for the selected variables, the method proceeds to procedure 515 where it is determined if a particular or predetermined termination is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If the condition in procedure 515 is satisfied, the method ends. If the condition in procedure 515 is not satisfied, the method proceeds to procedure 520 where values of the design variables for the illumination source and mask design layout are modified, and then to procedure 525 where new/modified optical aberrations are calculated and/or determined using modified values of the design variables for the illumination source and mask design layout or using modified values of the design variables for the illumination source and a simplified reticle of the modified mask design layout. Those new/modified optical aberrations define a modified projection optics model, which, along with the modified illumination source model (i.e. the illumination source model including the modified design variables), provide modified transmission cross coefficients TCCs which are used when calculating the cost function. Specifically, once the transmission cross coefficients TCCs are known, the aerial image, the resist image, the $f_{p_u}(z_1, z_2, \ldots, z_N)$ and the cost function can be computed. Examples of methods for determining and/or computing the transmission cross coefficients TCCs are described in U.S. Patent Application Ser. No. 61/412,372, filed on Nov. 10, 2010, which is incorporated by reference in its entirety.

Procedures 510-525 are iteratively repeated until the termination condition is satisfied.

In the methods of FIGS. 4 and 5, the source and mask can be optimized simultaneously (referred to as simultaneous optimization), according to embodiments. The terms "simultaneous", "simultaneously", "joint" and "jointly" as used herein mean that the design variables of the characteristics of the source, mask, projection optics and/or any other design variables, are allowed to change at the same time.

In another embodiment, instead of, or in addition to, calculating and/or determining the effect on the optical characteristics of the projection optics, it is envisioned that adjustable optical characteristics of the projection optics can be included in the design variables. Exemplary adjustable optical characteristics may include as lens manipulators, the temperature data or signal associated with the temperature data of one or more devices, e.g. heaters, that are utilized to control the temperature of an optical element of the projection system, Zernike coefficients. The SMO procedure can then be carried out and the design variables, including the adjustable optical characteristics, can be simultaneously adjusted so that the cost function is moved towards convergence.

The methods described herein are not limited lens heating but are applicable to include any effect on the optical characteristics of the projection optics induced by imaging the design layout (or a portion thereof) with the illumination source through the projection optics.

In one embodiment, the Zernike coefficients are among the design variable. Weight factors may be assigned to each of the Zernike coefficients. For example, a higher weight factor may be applied to the $10^{th}$ order Zernike coefficients than to the $5^{th}$ order Zernike coefficients.

In one embodiment, the SMO can use a predetermined projection optics model that accounts a predetermined effect on the optical characteristics of the projection optics. For example, if the lens heating is predetermined, e.g., empirically, the SMO can use a projection optics model that accounts for the predetermined lens heating.

Referring to FIGS. 6A-D, these figures show four different mask patterns, referred to as "1", "2", "3" and "4" (FIG. 6A, FIG. 6B, FIG. 6C and FIG. 6D) that show the lens heating effects on the resist image. As can be seen in FIGS. 6A-6D, lens heating is pattern dependent.

Figure 7A:
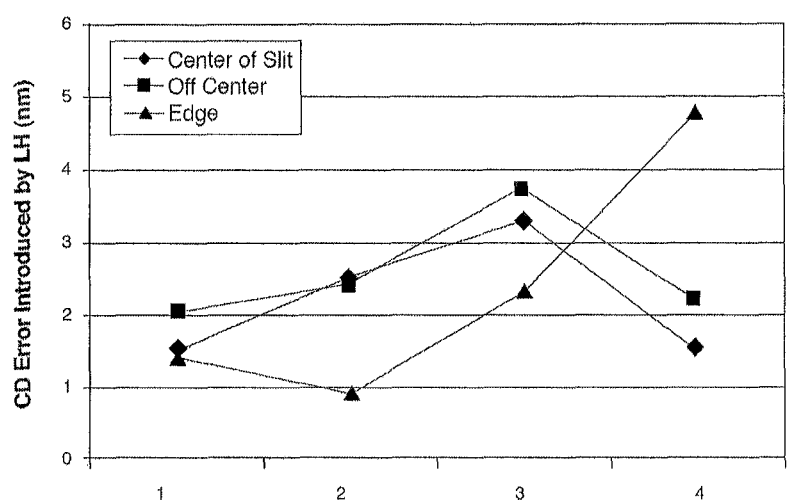
FIG. 7A represents critical dimension (CD) errors introduced by lens heating for the four different types of mask patterns of FIG. 6A.
Figure 7B:
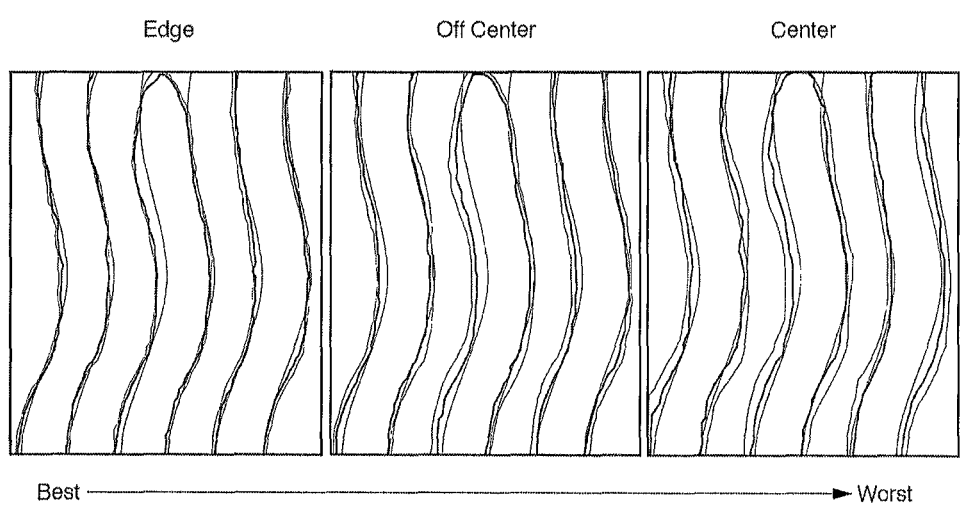
FIG. 7B shows the deformations of the image of the mask patterns resulting from the lens heating effects for mask pattern 3.

FIG. 7A represents critical dimension (CD) errors introduced by lens heating for the four different types of mask patterns of FIGS. 6A-D ("1", "2", "3" and "4") and for three different positions in the exposure field (center of slit, off center, and edge). FIG. 7B shows the deformations of the image of the mask patterns resulting from the lens heating effects for mask pattern 2. As can be seen in FIG. 7A, CD errors induced by lens heating can vary significantly between mask patterns and are field dependent.

Figure 8A:
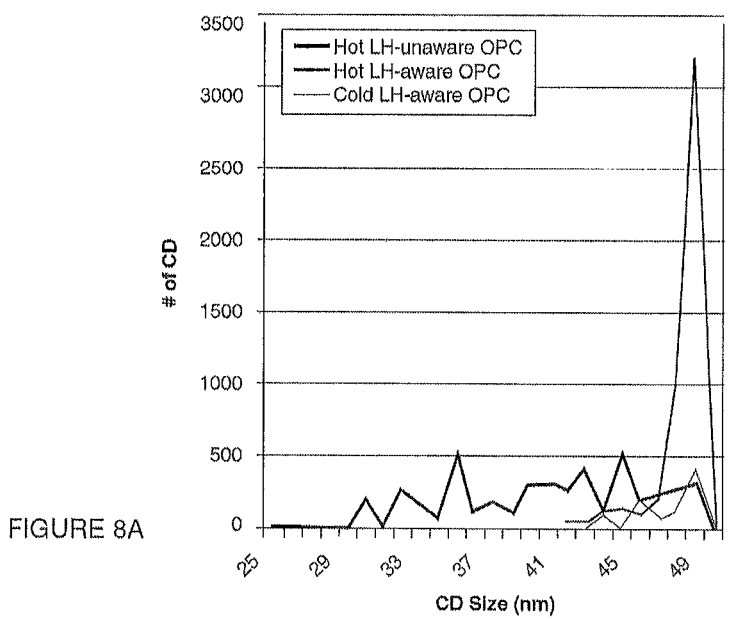
FIG. 8A shows the number of patterns that are within specification after performing a conventional optimization ("Hot Lens-Heating Unaware OPC") and after performing the optimization methods according to one or more embodiments ("Hot Lens-Heating Aware OPC")
Figure 8B:
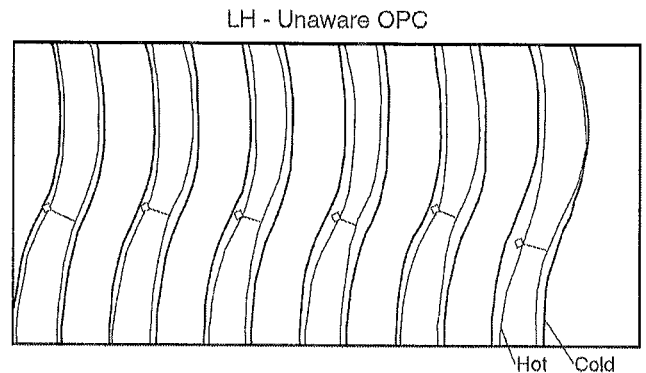
FIG. 8B shows the optimized pattern according to a conventional method and FIG. 8C shows the optimized pattern according to one or more embodiments.
Figure 8C:
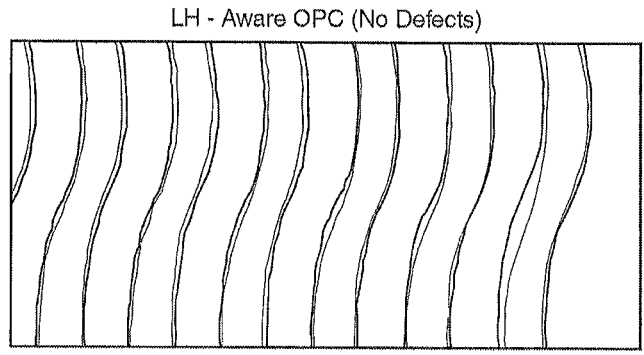

Referring to FIGS. 8A-C, FIG. 8A shows the number of patterns (corresponding to pattern "2") that are within specification after performing a conventional optimization (referred to as Hot Lens-Heating Unaware OPC) and after performing the optimization methods according to one or more embodiments (referred to as Lens-Heating Aware OPC). Results are provided for a single slit condition in FIG. 8A, namely the off slit center. A pattern is considered within specification when the critical dimensions (CDs) between two adjacent patterns is greater than 41 nm. FIG. 8B shows the optimized pattern according to a conventional method and FIG. 8C shows the optimized pattern according to one or more embodiments. In the caption of FIG. 8A, "Cold LH Aware OPC" and "Hot LH Aware OPC" simply mean the result of Lens-Heating Aware OPC applied to the projection optics in a cold state and a hot state, respectively. FIG. 8B plainly shows that Lens-Heating Unaware OPC does not make the images when the projection optics is in a cold state and the images when the projection optics is in a hot state almost identical. FIG. 8C plainly shows that Lens-Heating Aware OPC makes the images when the projection optics is in a cold state and the images when the projection optics is in a hot state almost identical.

As can be seen in FIGS. 8A-C, the optimization method according to one or more embodiments, which accounts for lens heating, provides imaging and mask design conditions that image all of the patterns within specification. By contrast, with the conventional optimization method, a significant number of patterns have a CD that is less than 41 nm.

Figures 9A, 9B, 9C:
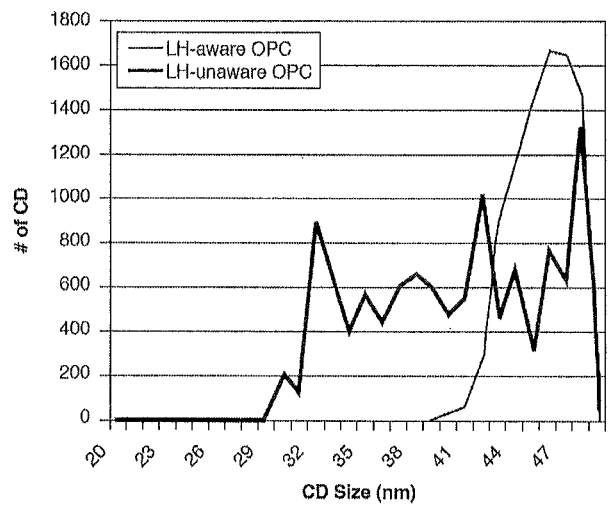
FIG. 9A shows the distribution of a pattern optimized according to one or more embodiments ("Hot Lens-Heating Aware OPC) and according to a conventional method ("Hot Lens-Heating Unaware OPC)
FIG. 9B shows CD results across the field obtained with the conventional method.
FIG. 9C shows results across the field obtained with the method according to one or more embodiments.

Referring now to FIGS. 9A-C, FIG. 9A shows the distribution of patterns optimized according to one or more embodiments (referred to as Hot Lens-Heating Aware OPC) and according to a conventional method (referred to as Hot Lens-Heating Unaware OPC). FIG. 9B shows results across the field (i.e. for different slit positions: center, off center and edge) obtained with the conventional method. FIG. 9C shows results across the field (i.e. for different slit positions: center, off center and edge) obtained with the method according to one or more embodiments.

As can be seen in FIGS. 9A and 9C, the optimization method according to one or more embodiments, which accounts for lens heating, provides imaging and mask design conditions that image all of the patterns across the field within specification. By contrast, with the conventional optimization method, a significant number of patterns have a CD that is less than 41 nm for all of the field positions.

Figure 10:
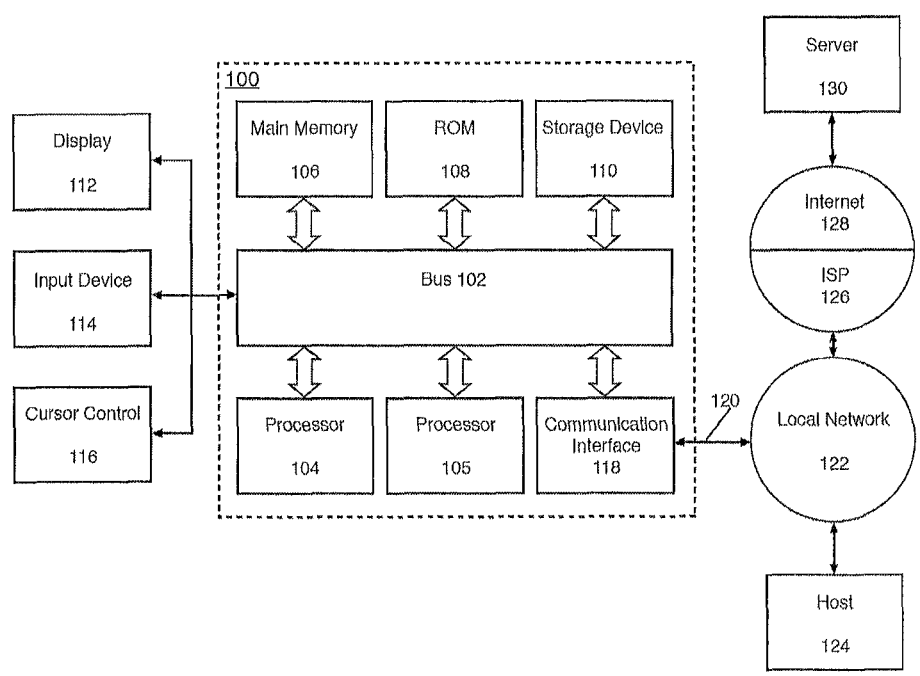
FIG. 10 is a block diagram of an example computer system in which embodiments can be implemented.

FIG. 10 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 11:
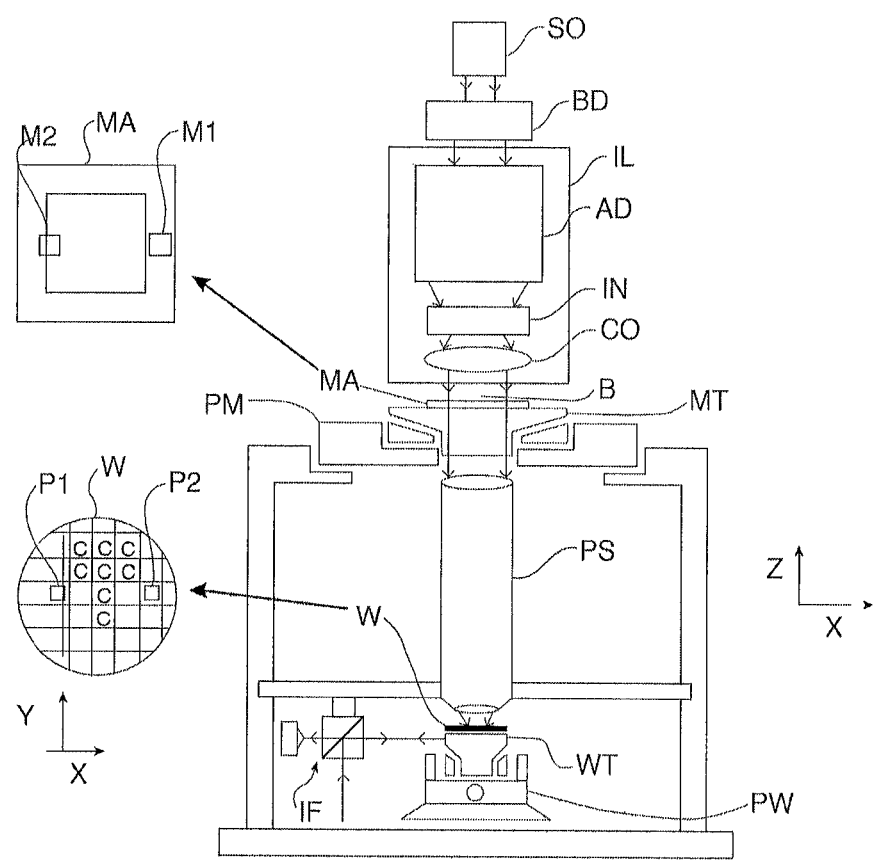
FIG. 11 is a schematic diagram of a lithographic projection apparatus to which embodiments are applicable.

FIG. 11 schematically depicts an exemplary lithographic projection apparatus whose illumination source could be optimized utilizing the methods described herein. The apparatus comprises:

- a radiation system IL, for supplying a projection beam B of radiation. In this particular case, the radiation system also comprises a radiation source SO;
- a first object table (mask table) MT provided with a mask holder for holding a patterning device MA (e.g., a mask or a reticle), and connected to first positioner for accurately positioning the mask with respect to item PS;
- a second object table (substrate table) WT provided with a substrate holder for holding a substrate W (e.g., a resist-coated silicon wafer), and connected to second positioner for accurately positioning the substrate with respect to item PS;
- a projection system ("lens") PS (e.g., a refractive, catoptric or catadioptric optical system) for imaging an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander Ex, for example. The illuminator IL may comprise an adjuster AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioner (and interferometric measuring device IF), the substrate table WT can be moved accurately, e.g. so as to position different target portions C in the path of the beam PB. Similarly, the first positioner can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

The invention may further be described using the following clauses:

1. A computer-implemented method for improving a lithographic process for imaging a portion of a design layout onto a substrate using a lithographic projection apparatus comprising an illumination source and projection optics, the method comprising:

computing a multi-variable cost function of a plurality of design variables that are characteristics of the lithographic process, at least some of the design variables being characteristics of the illumination source and the design layout, the computing of the multi-variable cost function accounting for an effect on optical characteristics of the projection optics induced by imaging the portion of the design layout with the illumination source through the projection optics; and reconfiguring the characteristics of the lithographic process by adjusting the design variables until a predefined termination condition is satisfied.

2. The method of clause 1, wherein the effect comprises a heating effect.

3. The method of any one of clauses 1-2, further comprising determining the effect using at least some of the design variables that are characteristics of the design layout and the illumination source.

4. The method of any one of clauses 1-3, wherein computing the multi-variable cost function comprises using a projection optics model that is a function of the effect.

5. The method of any one of clauses 1-4, wherein the reconfiguring comprises redetermining the effect using at least some of the design variables that are characteristics of the design layout and/or the illumination source and that are adjusted.

6. The method of any one of clauses 1-5, wherein the reconfiguring comprises computing the multi-variable cost function using the projection optics model.

7. The method of any one of clauses 1-6, wherein the design variables comprise an adjustable optical characteristic of the projection optics.

8. The method of clause 7, wherein the adjustable optical characteristic is a refractive index of at least a portion of the projection optics or a temperature of at least a portion of the projection optics.

9. The method of clause 7, wherein the adjustable optical characteristic is adjustable by a heater configured to heat an optical element of the projection optics.

10. The method of clause 7, wherein the adjustable optical characteristic is a Zernike coefficient of the projection optics.

11. The method of any one of clauses 1-10, wherein the portion of the design layout comprises one or more of the following: an entire design layout, a clip, a section of a design layout that is known to have one or more critical features, and a section of the design layout where one or more critical features have been identified by a pattern selection method.

12. The method of any one of clauses 1-11, wherein the predefined termination condition includes one or more of: minimization of the cost function; maximization of the cost function; reaching a preset number of iterations; reaching a value of the cost function equal to or beyond a preset threshold value; reaching a predefined computation time; and, reaching a value of the cost function within an acceptable error limit.

13. The method of any one of clauses 1-12, wherein the iterative reconfiguration is performed without constraints or with constraints dictating the range of at least some of the design variables.

14. The method of any one of clauses 1-13, wherein at least some of the design variables are under constraints representing physical restrictions in a hardware implementation of the lithographic projection apparatus.

15. The method of any one of clauses 1-14, wherein the constraints include one or more of: tuning ranges, rules governing mask manufacturability, and interdependence between the design variables.

16. The method of any one of clauses 1-15, wherein the cost function is a function of one or more of the following lithographic metrics: edge placement error, critical dimension, resist contour distance, worst defect size, and best focus shift.

17. The method of any one of clauses 1-16, wherein the cost function is minimized by solving polynomials, including higher-order polynomials of the design variables.

18. The method of any one of clauses 1-17, wherein the design layout comprises at least one assist feature.

19. The method of clause 18, wherein the at least one assist feature comprises a SRAF (Sub Resolution Assist Feature) and/or PRAF (Printable Resolution Assist Feature).

20. The method of any one of clauses 1-2, further comprising determining the effect using at least some of the design variables that are characteristics of the illumination source and a simplified reticle.

21. The method of clause 20, wherein the simplified reticle is selected from a group consisting of an estimated reticle transmission, a measured average transmission of a physical mask, a clip from a reticle, and a plurality of discrete portions of a reticle.

22. A computer program product comprising a computer readable medium having instructions recorded thereon, the instructions when executed by a computer implementing the method of any of the above clauses.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the embodiments as described without departing from the scope of the claims set out below.

What is claimed is:

1. A method for improving a lithographic process for imaging at least a portion of a design layout onto a substrate using a lithographic projection apparatus comprising an illumination system and projection optics, the method comprising:
   computing, by a hardware computer system, a multi-variable cost function of a plurality of design variables that are characteristics of the lithographic process, at least some of the design variables being characteristics of illumination to be provided by the illumination system and of the design layout, the computing of the multi-variable cost function accounting for an effect on an optical characteristic of the projection optics induced by imaging the portion of the design layout with the illumination through the projection optics; and
   reconfiguring the characteristics of the lithographic process by adjusting the design variables of the cost function until a defined termination condition of computing the cost function is satisfied,
   wherein the effect is determined using at least some of the design variables that are characteristics of the design layout and of the illumination.

2. The method of claim 1, wherein the effect comprises a heating effect.

3. The method of claim 1, wherein computing the multi-variable cost function comprises using a projection optics model that is a function of the effect.

4. The method of claim 1, wherein the reconfiguring comprises redetermining the effect using at least some of the design variables that are characteristics of the design layout and/or of the illumination and that are adjusted.

5. The method of claim 1, wherein the reconfiguring comprises computing the multi-variable cost function using a projection optics model that is a function of the effect.

6. The method of claim 1, wherein the design variables comprise an adjustable optical characteristic of the projection optics.

7. The method of claim 6, wherein the adjustable optical characteristic comprises a refractive index of at least a portion of the projection optics, or a temperature of at least a portion of the projection optics, or a Zernike coefficient of the projection optics.

8. The method of claim 6, wherein the adjustable optical characteristic is adjustable by a heater configured to heat an optical element of the projection optics.

9. The method of claim 1, wherein the design layout comprises at least one assist feature and wherein the at least one assist feature comprises a SRAF (Sub Resolution Assist Feature) and/or a PRAF (Printable Resolution Assist Feature).

10. The method of claim 1, further comprising determining the effect using at least some of the design variables that are characteristics of the illumination and a simplified reticle.

11. The method of claim 10, wherein the simplified reticle is selected from: an estimated reticle transmission, a measured average transmission of a physical mask, a clip from a reticle, or a plurality of discrete portions of a reticle.

12. A computer program product comprising a non-transitory computer readable medium having instructions recorded thereon, the instructions configured to cause a computer to:
compute a multi-variable cost function of a plurality of design variables that are characteristics of a lithographic process for imaging a portion of a design layout onto a substrate using a lithographic projection apparatus that comprises an illumination system and projection optics, at least some of the design variables being characteristics of illumination to be provided by the illumination system and of the design layout, the computing of the multi-variable cost function accounting for an effect on an optical characteristic of the projection optics induced by imaging the portion of the design layout with the illumination through the projection optics; and
reconfigure the characteristics of the lithographic process by adjusting the design variables of the cost function until a defined termination condition of computing the cost function is satisfied,
wherein the effect is determined using at least some of the design variables that are characteristics of the design layout and of the illumination.

13. The computer program product of claim 12, wherein the effect comprises a heating effect.

14. The computer program product of claim 12, wherein the instructions configured to compute the multi-variable cost function are configured to use a projection optics model that is a function of the effect.

15. The computer program product of claim 12, wherein the instructions are further configured to determine the effect using at least some of the design variables that are characteristics of the illumination and a simplified reticle.

16. The computer program product of claim 15, wherein the simplified reticle is selected from: an estimated reticle transmission, a measured average transmission of a physical mask, a clip from a reticle, or a plurality of discrete portions of a reticle.

17. A computer program product comprising a non-transitory computer readable medium having instructions recorded thereon, the instructions configured to cause a computer to:
compute a multi-variable cost function of a plurality of design variables that are characteristics of a lithographic process for imaging a portion of a design layout onto a substrate using a lithographic projection apparatus that comprises an illumination system and projection optics, at least some of the design variables being characteristics of illumination to be provided by the illumination system and of the design layout, the computing of the multi-variable cost function accounting for an effect on an optical characteristic of the projection optics induced by imaging the portion of the design layout with the illumination through the projection optics; and
reconfigure the characteristics of the lithographic process by adjusting the design variables of the cost function until a defined termination condition of computing the cost function is satisfied,
wherein computation of the multi-variable cost function comprises use of a projection optics model that is a function of the effect.

18. The computer program product of claim 17, wherein the effect comprises a heating effect.

19. The computer program product of claim 17, wherein the instructions are further configured to determine the effect using at least some of the design variables that are characteristics of the illumination and a simplified reticle.

20. The computer program product of claim 19, wherein the simplified reticle is selected from: an estimated reticle transmission, a measured average transmission of a physical mask, a clip from a reticle, or a plurality of discrete portions of a reticle.

* * * * *